United States Patent [19]

Takahashi

[11] Patent Number: 5,744,836
[45] Date of Patent: Apr. 28, 1998

[54] INSULATING GATE TYPE FIELD EFFECT TRANSISTOR

[75] Inventor: Kenichiro Takahashi, Tokyo, Japan

[73] Assignee: NEC Corporation, Tokyo, Japan

[21] Appl. No.: 808,170

[22] Filed: Feb. 28, 1997

[51] Int. Cl.⁶ .......................... H01L 29/76; H01L 29/94; H01L 31/062
[52] U.S. Cl. .......................... 257/344; 257/342; 257/343
[58] Field of Search .................................. 257/344, 408, 257/409, 412, 342, 343, 341

[56] References Cited

U.S. PATENT DOCUMENTS 4,971,922  11/1990  Watabe et al. .......................... 257/408

FOREIGN PATENT DOCUMENTS 4-58537   2/1992  Japan ........................................ 257/408
4-208571  7/1992  Japan .

*Primary Examiner*—Wael Fahmy
*Attorney, Agent, or Firm*—Young & Thompson

[57] ABSTRACT

There is provided a semiconductor device including a substrate having a first conductivity, a source region formed at a surface of the substrate, the source region having a second conductivity and including a lightly doped region and a heavily doped region, a drain region formed at a surface of the substrate, the drain region having a second conductivity and including a lightly doped region and a heavily doped region, an insulating film covering the substrate, a first gate electrode formed on the insulating film between the source region and the drain region, a second gate electrode formed on the insulating film above the lightly doped region of the drain region for controlling the number of carriers in the lightly doped region of the drain region, and a third gate electrode formed on the insulating film above the lightly doped region of the source region for controlling the number of carriers in the lightly doped region of the source region. In accordance with the semiconductor device, it is possible to select among a high break down voltage mode and a low resistance mode in a single semiconductor device by applying a certain voltage to the second and third gate electrodes. Thus, the semiconductor device can operate in a high break down mode while turned off in which case a high break down voltage is required, or can operate in a low resistance mode while turned on in which case a low resistance is required.

19 Claims, 3 Drawing Sheets

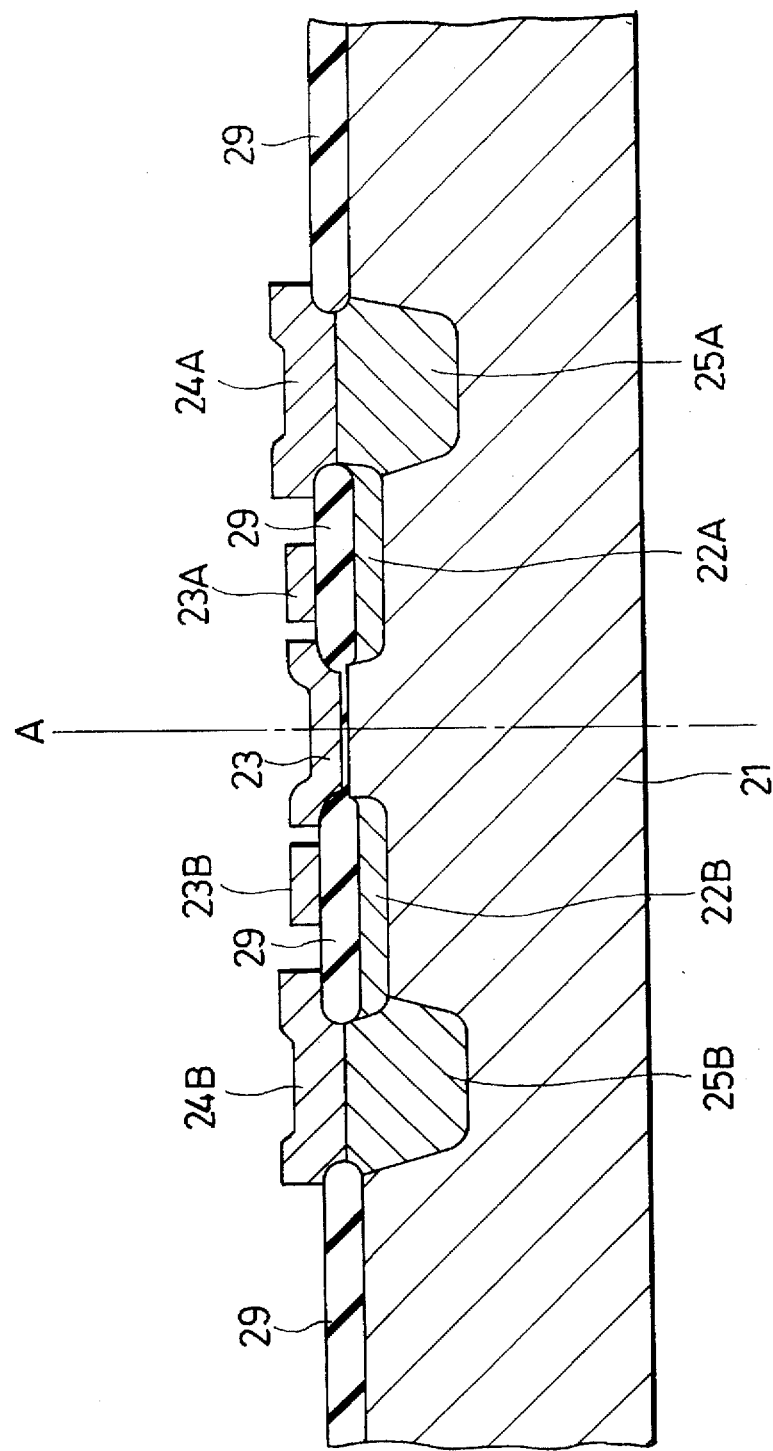

INSULATING GATE TYPE FIELD EFFECT TRANSISTOR

BACKGROUND OF THE INVENTION

1. Field of the Invention

The invention relates to a semiconductor device, and more particularly to an insulating gate type field effect transistor having an enhanced break down voltage and a decreased internal resistance.

2. Description of the Related Art

An insulating gate type field effect transistor (hereinafter, field effect transistor is referred to simply as "FET") is generally provided with a lightly doped region in a drain diffusion layer in order to ensure a break down voltage between a drain diffusion layer and a substrate. One of such insulating gate type FETs has been suggested in Japanese Unexamined Patent Publication No. 4208571 published on Jul. 30, 1992. According to the Publication, for example, when a critical working voltage, which is defined as a difference in a source voltage between maximum and minimum voltages, is smaller than a certain voltage such as 50 V, source and drain diffusion layers are formed to have a double diffusion layered structure including heavily and lightly doped diffusion layers. On the other hand, when a critical working voltage is in the range of 40 V to 80 V, source and drain diffusion layers are formed to have a treble diffusion layered structure including heavily, moderately and lightly doped diffusion layers.

One of conventional insulating gate type FETs is illustrated in FIG. 1. The illustrated insulating gate type FET includes a p-type substrate 31, a pair of N⁻ type extended drain diffusion layers 32 formed at a surface of the p-type substrate 31, a N⁺ type drain diffusion layer 35 formed at a surface of the p-type substrate 31 and sandwiched between the N⁻ type extended drain diffusion layers 32, a N⁺ type source diffusion layer 36 formed at a surface of the p-type substrate 31, a P+ type source diffusion layer 37 formed adjacent to the N+ type source diffusion layer 36 at a surface of the p-type substrate 31, a drain electrode 34 formed directly on the N⁺ type drain diffusion layer 35, a source electrode 38 formed on both the N⁺ type source diffusion layer 36 and the P+ type source diffusion layer 37, an oxide film 39 covering the p-type substrate 31 except the drain electrode 34 and the source electrode 38, and gate electrodes 33 each formed on the oxide film 39 between the N⁻ type extended drain diffusion layers 32 and the N⁺ type source diffusion layer 36. The gate electrodes 33 are located in symmetry with each other about a central axis A of the drain electrode 34 or the N⁺ type drain diffusion layer 35.

As illustrated in FIG. 1, a conventional insulating gate type FET is designed to have a drain diffusion layer formed in a double diffusion layered structure in order to ensure a break down voltage thereof. Specifically, the drain diffusion layers 32 located closer to the gate electrode 33 than the drain diffusion layer 35 are designed to have a lower impurity concentration than that of the drain diffusion layer 35 on which the drain electrode 34 is to be formed.

However as explained earlier, the above mentioned conventional insulating gate type FET includes the N⁻ type extended drain diffusion layers 32 comprising lightly doped diffusion layers so as to ensure a break down voltage, which is accompanied with a problem that an internal resistance is increased, to the contrary. For instance, if the conventional insulating gate type FET is designed to have a high break down voltage so as to use as a switch, ON-state resistance grows high.

SUMMARY OF THE INVENTION

In view of the foregoing problem of the above mentioned prior semiconductor device, it is an object of the present invention to provide a semiconductor device, in particular, an insulating gate type field effect transistor, which is capable of being electrically switched between a high break down voltage mode and a low resistance mode.

There is provided a semiconductor device including (a) a substrate having a first conductivity, (b) a source region formed at a surface of the substrate, the source region having a second conductivity, (c) a drain region formed at a surface of the substrate, the drain region having a second conductivity and including a lightly doped region and a heavily doped region, (d) an insulating film covering the substrate, (e) a first gate electrode formed on the insulating film between the source region and the drain region, and (f) a second gate electrode formed on the insulating film above the lightly doped region of the drain region for controlling the number of carriers in the lightly doped region of the drain region.

There is further provided a semiconductor device including (a) a substrate having a first conductivity, (b) source regions formed at a surface of the substrate, the source regions having a second conductivity, (c) a drain region formed at a surface of the substrate, the drain region having a second conductivity and including two lightly doped regions and a heavily doped region sandwiched between the two lightly doped regions, (d) an insulating film covering the substrate, (e) two first gate electrodes formed on the insulating film between the source regions and the two lightly doped regions of the drain region, and (f) two second gate electrodes formed on the insulating film above the two lightly doped regions of the drain region for controlling the number of carriers in the two lightly doped regions of the drain region. For instance, the two second gate electrodes may be disposed in symmetry with each other about the heavily doped region of the drain region.

There is still further provided a semiconductor device including (a) a substrate having a first conductivity, (b) a source region formed at a surface of the substrate, the source region having a second conductivity and including a lightly doped region and a heavily doped region, (c) a drain region formed at a surface of the substrate, the drain region having a second conductivity and including a lightly doped region and a heavily doped region, (d) an insulating film covering the substrate, (e) a first gate electrode formed on the insulating film between the source region and the drain region, (f) a second gate electrode formed on the insulating film above the lightly doped region of the drain region for controlling the number of carriers in the lightly doped region of the drain region, and (g) a third gate electrode formed on the insulating film above the lightly doped region of the source region for controlling the number of carriers in the lightly doped region of the source region.

There is yet further provided an insulating gate type field effect transistor including (a) a substrate having a first conductivity, (b) a drain diffusion layer formed at a surface of the substrate and having a second conductivity, (c) a source diffusion layer formed at a surface of the substrate and having a second conductivity, (d) an insulating film covering the substrate, (e) a first gate electrode formed on the insulating film between the source and drain diffusion layers, and (f) a second gate electrode formed on the drain diffusion layer for controlling the number of carriers in the drain diffusion layer.

There is still yet further provided an insulating gate type field effect transistor including (a) a substrate having a first conductivity, (b) a drain diffusion layer formed at a surface of the substrate, the drain diffusion layer having a second conductivity and including two lightly doped regions and a heavily doped region sandwiched between the two lightly doped regions, (c) a source diffusion layer formed at a surface of the substrate and having a second conductivity, (d) an insulating film covering the substrate, (e) a first gate electrode formed on the insulating film between the source and drain diffusion layers, and (f) two second gate electrodes formed on the two lightly doped regions of the drain diffusion layer for controlling the number of carriers in the two lightly doped regions of the drain diffusion layer.

There is further provided an insulating gate type field effect transistor including (a) a substrate having a first conductivity, (b) a drain diffusion layer formed at a surface of the substrate and having a second conductivity, (c) a source diffusion layer formed at a surface of the substrate and having a second conductivity, (d) an insulating film covering the substrate, (e) a first gate electrode formed on the insulating film between the source and drain diffusion layers, (f) a second gate electrode formed on the drain diffusion layer for controlling the number of carriers in the drain diffusion layer, and (g) a third gate electrode formed on the source layer for controlling the number of carriers in the source diffusion layer.

In accordance with the present invention, the second gate electrode or both the second and third gate electrodes is(are) provided electrically, independently from the first gate electrode formed between the source and drain regions. The present invention makes it possible to select among a high break down voltage mode and a low resistance mode in a single semiconductor device by applying a certain voltage to the second gate electrode or both the second and third gate electrodes. Thus, the semiconductor device can operate in a high break down mode while turned off in which case a high break down voltage is required, or can operate in a low resistance mode while turned on in which case a low resistance is required. Signals to be applied to the second gate electrode or both the second and third gate electrodes in synchronization with on/off of an insulating gate type field effect transistor for switching a mode among the above mentioned two modes can be provided from an integrated circuit which may be formed on a common chip on which a semiconductor device in accordance with the present invention is also formed. Hence, the semiconductor device can avoid to have increased complexity in a circuitry.

Furthermore, when the semiconductor device in accordance with the present invention is used as a bidirectional switch such as a pass transistor in which case a high break down voltage is required while a semiconductor device is turned off and, in addition, polarity or direction of a signal cannot be identified, a low voltage is applied to the second and third gate electrodes to thereby render the semiconductor device in a high break down voltage mode while the semiconductor device is turned off, whereas a high voltage is applied to the second and third gate electrodes to thereby render the semiconductor device in a low ON-state resistance mode while the semiconductor device is turned on.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which:

FIG. 3 is a cross-sectional view of an insulating gate type field effect transistor made in accordance with the second embodiment of the present invention.

DESCRIPTION OF THE PREFERRED EMBODIMENTS

Figure 2:
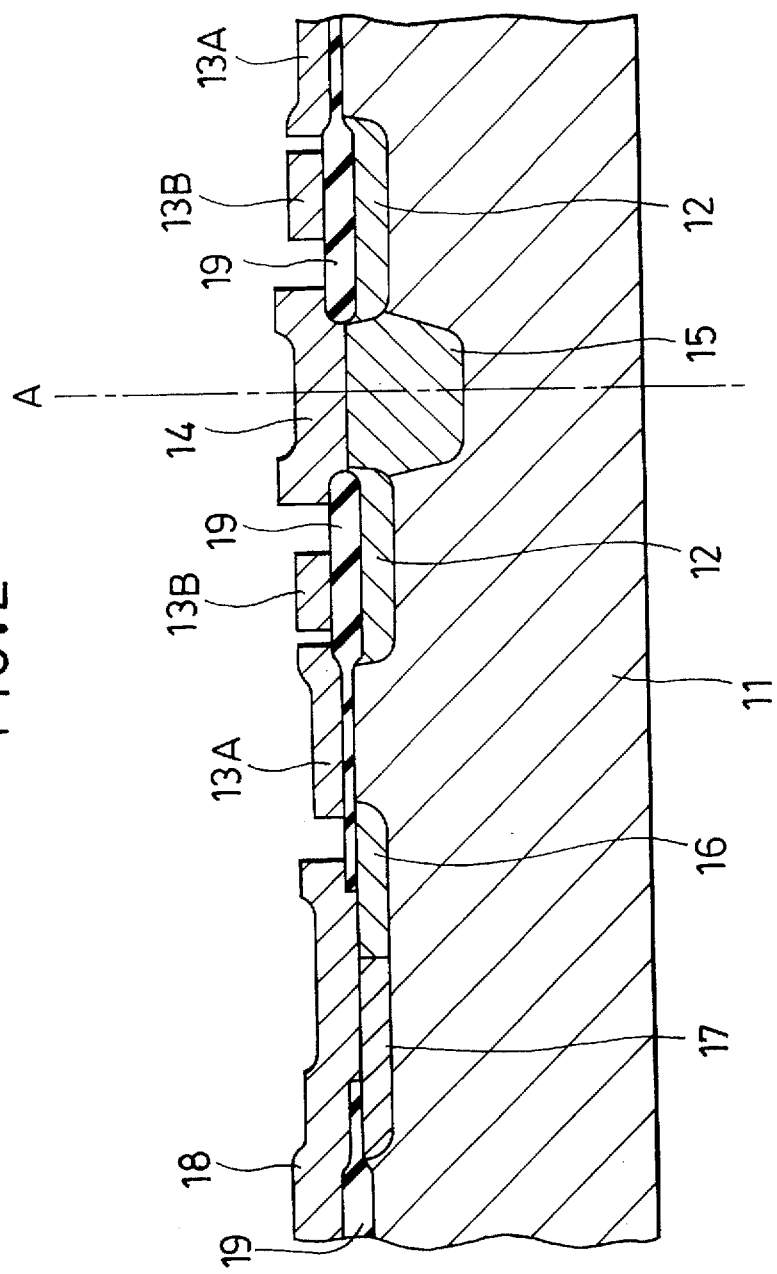
FIG. 2 is a cross-sectional view of an insulating gate type field effect transistor made in accordance with the first embodiment of the present invention.

Referring to FIG. 2, an insulating gate type FET made in accordance with the first embodiment of the present invention includes a p-type substrate 11, a pair of $N^-$ type extended drain diffusion layers 12 formed at a surface of the p-type substrate 11, a $N^+$ type drain diffusion layer 15 formed at a surface of the p-type substrate 11 and sandwiched between the $N^-$ type extended drain diffusion layers 12, a $N^+$ type source diffusion layer 16 formed at a surface of the p-type substrate 11, a P+ type source diffusion layer 17 formed adjacent to the $N^+$ type source diffusion layer 16 at a surface of the p-type substrate 11, a drain electrode 14 formed directly on the $N^+$ type drain diffusion layer 15, a source electrode 18 formed on both the $N^+$ type source diffusion layer 16 and the P+ type source diffusion layer 17, an oxide film 19 covering the p-type substrate 11 except the drain electrode 14 and the source electrode 18, a pair of first gate electrodes 13A each formed on the oxide film 19 between the $N^-$ type extended drain diffusion layer 12 and the $N^+$ type source diffusion layer 16, and a pair of second gate electrodes 13B each formed on the insulating film 19 above the $N^-$ type extended drain diffusion layer 12. The first and second gate electrodes 13A and 13B are located in symmetry with each other about a central axis A of the drain electrode 14 or the $N^+$ type drain diffusion layer 15.

The first gate electrodes 13A are designed to receive control signals for turning the transistor on or off. The second gate electrodes 13B receive a voltage which can be optionally varied.

Among performance parameters of an insulating gate type FET, a break down voltage and ON-state resistance are in antinomic relation, and hence, if a transistor is designed to have a higher break down voltage, the transistor cannot but to have a greater ON-state resistance or internal resistance. As mentioned earlier, the $N^-$ type extended drain diffusion layer 12 is provided to ensure a break down voltage for a transistor. If the $N^-$ type extended drain diffusion layer 12 is designed to have a higher carrier concentration, a break down voltage can be decreased, but, instead, an internal resistance thereof is increased.

In the first embodiment, a voltage applied to the second gate electrodes 13B is varied to thereby control the carrier concentration of the $N^-$ type extended drain diffusion layers 12. As a result, it is possible to select a desired mode among a high break down voltage mode in which the insulating gate type FET is made to have a high internal resistance, but can have a high break down voltage, and a low resistance mode in which the insulating gate type FET is made to have a low break down voltage, but can have a low internal resistance.

There are various manners for applying a voltage to the second gate electrodes 13B. For instance, a voltage of 0 V is applied to the source electrode 18, which makes the p-type substrate 11 to have a voltage of 0 V due to the function of the diffusion layers 16 and 17, and a voltage of 0 V is also applied to both the first gate electrodes 13A and the second gate electrodes 13B while the insulating gate type FET is turned off. While the insulating gate type PET is turned on, a voltage of 5 V which corresponds to a high level in a low voltage logic circuit is applied to the first gate electrodes 13A, and a voltage of 150 V which corresponds to a high level in a high voltage logic circuit is applied to the second gate electrodes 13B.

Since the second gate electrodes 13B are kept at 0 V while the transistor is turned off, the N⁻ type extended drain diffusion layers 12 are caused to have a low carrier concentration, resulting in that a high break down voltage, for instance, equal to or greater than 180 V can be ensured.

On the other hand, the N⁻ type extended drain diffusion layers 12 have a high carrier concentration because a highly positive voltage is applied to the second gate electrodes 13B while the transistor is turned on, and hence, ON-state resistance can be reduced. For instance, ON-state resistance can be reduced by about 30% comparing to a case in which a voltage of 5 V is applied to the second gate electrodes 13B.

As a high voltage logic circuit dealing with about 100 V may be generally formed on a common chip on which a low voltage logic circuit dealing with, for instance, about 5 V is also formed, it is not necessary to form an additional logic circuit for applying control voltages to the first gate electrodes 13A and the second gate electrodes 13B.

With reference to FIG. 3, an insulating gate type FET made in accordance with the second embodiment of the present invention includes a p-type substrate 21, a N⁻ type extended drain diffusion layer 22A formed at a surface of the p-type substrate 21, a N⁺ type drain diffusion layer 25A formed at a surface of the p-type substrate 21 and adjacent to the N⁻ type extended drain diffusion layer 22A, a N⁻ type extended source diffusion layer 22B formed at a surface of the p-type substrate 21, a N⁺ type source diffusion layer 25B formed at a surface of the p-type substrate 21 arid adjacent to the N⁻ type extended source diffusion layer 22B, a drain electrode 24A formed directly on the N⁺ type drain diffusion layer 24A, a source electrode 24B formed on the N⁺ type source diffusion layer 25B, an oxide film 29 covering the p-type substrate 21 except the drain electrode 24A and the source electrode 24B, a first gate electrode 23 formed on the oxide film 29 between the N⁻ type extended drain diffusion layer 22A and the N⁻ type source diffusion layer 22B, a second gate electrode 23A formed on the insulating film 29 above the N⁻ type extended drain diffusion layer 22A, and a third gate electrode 23B formed on the insulating film 29 above the N⁻ type extended source diffusion layer 22B. The second and third gate electrodes 23A and 23B are located in symmetry with each other about a central axis A of the first gate electrode 23. Similarly, the drain electrode 24, the N+ type drain diffusion layer 25A and the N⁻ type extended drain diffusion layer 22A are located in symmetry with the source electrode 24B, the N+ type source diffusion layer 25B and the N⁻ type extended source diffusion layer 22B about the axis A, respectively.

Similarly to the insulating gate type FET made in accordance with the first embodiment, the first gate electrode 23 is designed to receive control signals for turning the transistor on or off. The second and third gate electrodes 23A and 23B receive a voltage which can be optionally varied.

Figure 1:
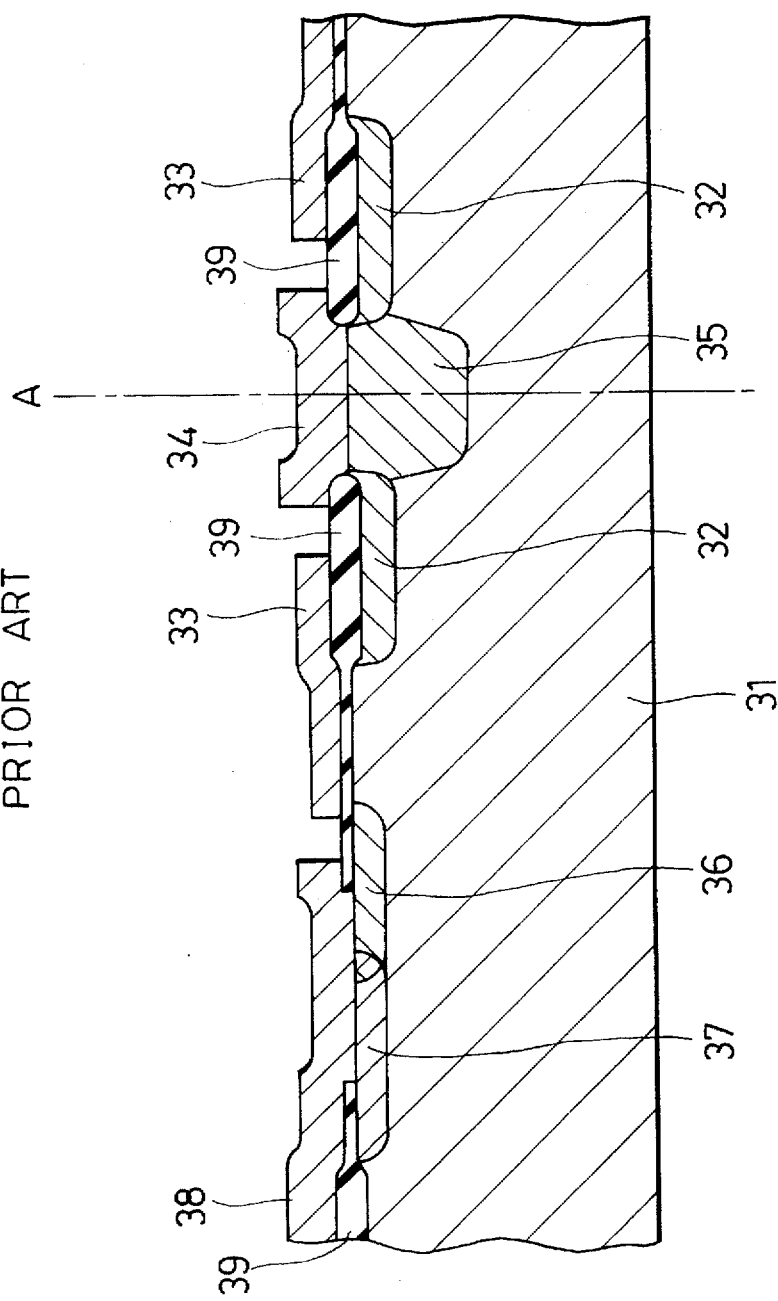
FIG. 1 is a cross-sectional view of a conventional insulating gate type field effect transistor.

In general, an extended drain diffusion layer is formed only by one, close to a drain region having a great voltage difference relative to a substrate due to a restriction on applying a voltage, as illustrated in FIG. 1. However, if an insulating gate type FET is applied to a switch such as an analog switch where a great voltage difference is established between a substrate and a drain region and also between a substrate and a source region, it is required that extended drain diffusion layers are provided in symmetry with each other about a central axis of the first gate electrode 23, as illustrated in FIG. 3. Hence, the second gate electrode 23A formed on the N⁻ type extended drain diffusion layer 22A and the third gate electrode 23B formed on the N⁻ type extended source diffusion layer 22B are located in symmetry with each other.

While the transistor illustrated in FIG. 1 is turned off, the source and drain regions are required to have a high break down voltage. However, a polarity of the break down voltage cannot be identified in most cases. Thus, while the transistor in accordance with the embodiment is turned off, a voltage is applied to the second and third gate electrodes 23A and 23B so that a carrier concentration in the extended drain and source diffusion layers 22A and 22B associated with the second and third gate electrodes 23A and 23B is decreased.

On the other hand, a transistor is in general not required to have a high break down voltage between source and drain regions, but required to have a small internal resistance. Hence, while the transistor in accordance with the embodiment is turned on, a voltage is applied to the second and third gate electrodes 23A and 23B so that a carrier concentration in the extended drain and source diffusion layers 22A and 22B is increased.

When a voltage is applied to the second and third gate electrodes 23A and 23B, it is not necessary to prepare an additional logic circuit for providing control voltages to the second and third gate electrodes 23A and 23B, because logic circuits dealing with low and high voltages are in general established in an integrated circuit including an insulating gate type FET. For instance, what is required for providing control voltages to the second and third gate electrodes 23A and 23B is merely to vary wiring pattern in some cases. Thus, a structure of FET does never become more complicated than as it is.

For instance, if a voltage of the second and third gate electrodes 23A and 23B relative to the substrate 21 is varied from 0 V to 50 V, a break down voltage is decreased from 80 V to 20 V. However, ON-state resistance is advantageously decreased from 5Ω to 1Ω.

If a conventional insulating gate type FET having a break down voltage of 80 V and ON-state resistance of 1Ω is substituted for the above mentioned insulating gate type FET having a break down voltage of 20 V and ON-resistance of 1Ω, the conventional FET has to have an area about four times greater than an area of the latter FET which is made in accordance with the second embodiment. That is, considering with regard only to a resistance for simplicity, a resistance in FET having a break down voltage of 80 V is four times greater than a resistance in FET having a break down voltage of 20 V, since a resistance R is defined as a quotient of a voltage V to a current I (R=V/I). As a result, the former FET- cannot but to have an area four times greater than an area of the latter FET.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 7-309997 filed on Nov. 2, 1995 including specification, claims, drawings and summary is incorporated herein by reference in its entirety.

What is claimed is:

1. A semiconductor device comprising:
   (a) a substrate having a first conductivity;
   (b) a source region formed at a surface of said substrate, said source region having a second conductivity;
   (c) a drain region formed at a surface of said substrate, said drain region having a second conductivity and including a lightly doped region and a heavily doped region, said drain region having a length on an order of one of microns and tens of microns;
   (d) an insulating film covering said substrate;
   (e) a first gate electrode formed on said insulating film between said source region and said drain region; and
   (f) a second gate electrode formed on said insulating film above said lightly doped region of said drain region for controlling the number of carriers in said lightly doped region of said drain region, said second gate electrode for receiving a voltage for varying carrier concentration in said lightly doped region.

2. A semiconductor device comprising:
   (a) a substrate having a first conductivity;
   (b) source regions formed at a surface of said substrate, said source regions having a second conductivity;
   (c) a drain region formed at a surface of said substrate, said drain region having a second conductivity and including two lightly doped regions and a heavily doped region sandwiched between said two lightly doped regions, said drain region having a length on an order of one of microns and tens of microns;
   (d) an insulating film covering said substrate;
   (e) two first gate electrodes formed on said insulating film between said source regions and said two lightly doped regions of said drain region; and
   (f) two second gate electrodes formed on said insulating film above said two lightly doped regions of said drain region for controlling the number of carriers in said two lightly doped regions of said drain region, said second gate electrodes for receiving a voltage for varying carrier concentration in said two lightly doped regions.

3. The semiconductor device as set forth in claim 2, wherein said two second gate electrodes are disposed in symmetry with each other about said heavily doped region of said drain region.

4. The semiconductor device as set forth in claim 3, wherein said two first gate electrodes are disposed in symmetry with each other about said heavily doped region of said drain region.

5. The semiconductor device as set forth in claim 2, wherein said second gate electrodes are adapted to receive a voltage so that carrier concentration in said lightly doped regions of said drain region is increased when said semiconductor device is turned on, and is adapted to receive a voltage so that carrier concentration in said lightly doped regions of said drain region is decreased when said semiconductor device is turned off.

6. A semiconductor device comprising:
   (a) a substrate having a first conductivity;
   (b) a source region formed at a surface of said substrate, said source region having a second conductivity and including a lightly doped region and a heavily doped region;
   (c) a drain region formed at a surface of said substrate, said drain region having a second conductivity and including a lightly doped region and a heavily doped region; said drain region having a length on an order of one of microns and tens of microns;
   (d) an insulating film covering said substrate;
   (e) a first gate electrode formed on said insulating film between said source region and said drain region;
   (f) a second gate electrode formed on said insulating film above said lightly doped region of said drain region for controlling the number of carriers in said lightly doped region of said drain region; and
   (g) a third gate electrode formed on said insulating film above said lightly doped region of said source region for controlling the number of carriers in said lightly doped region of said source region,
   said second and third gate electrodes for receiving a voltage for varying carrier concentration in said lightly doped region of said drain and source regions.

7. The semiconductor device as set forth in claim 6, wherein said second and third gate electrodes are adapted to receive a voltage so that carrier concentration in said lightly doped regions of said drain and source regions is increased when said semiconductor device is turned on, and are adapted to receive a voltage so that carrier concentration in said lightly doped regions of said drain and source regions is decreased when said semiconductor device is turned off.

8. The semiconductor device as set forth in claim 6 further comprising a drain electrode formed on said heavily doped region of said drain region and a source electrode formed on said heavily doped region of said source region,
   when one of said drain and source electrodes is to receive a high voltage and the other a low voltage, a low voltage is applied to one of said second and third gate electrodes in dependence on whether a high voltage is applied to said drain or source electrode so that a break down voltage of said semiconductor device is not decreased, and a high voltage is applied to the other of said second and third gate electrodes so that an internal resistance of said semiconductor device is decreased.

9. The semiconductor device as set forth in claim 6, wherein said second and third gate electrodes are disposed in symmetry with each other about said first gate electrode.

10. The semiconductor device as set forth in claim 9, wherein said second and third gate electrodes are adapted to receive a voltage so that carrier concentration in said lightly doped regions of said drain and source regions is increased when said semiconductor device is turned on, and are adapted to receive a voltage so that carrier concentration in said lightly doped regions of said drain and source regions is decreased when said semiconductor device is turned off.

11. The semiconductor device as set forth in claim 9 further comprising a drain electrode formed on said heavily doped region of said drain region and a source electrode formed on said heavily doped region of said source region,
   when one of said drain and source electrodes is to receive a high voltage and the other a low voltage, a low voltage is applied to one of said second and third gate electrodes in dependence on whether a high voltage is applied to said drain or source electrode so that a break down voltage of said semiconductor device is not decreased, and a high voltage is applied to the other of said second and third gate electrodes so that an internal resistance of said semiconductor device is decreased.

12. An insulating gate type field effect transistor comprising:
   (a) a substrate having a first conductivity;
   (b) a drain diffusion layer formed at a surface of said substrate and having a second conductivity, said drain diffusion layer including a lightly doped region and a heavily doped region, said drain diffusion layer having a length on an order of one of microns and tens of microns;

(c) a source diffusion layer formed at a surface of said substrate and having a second conductivity;

(d) an insulating film covering said substrate;

(e) a first gate electrode formed on said insulating film between said source diffusion layer and said lightly doped region of said drain diffusion layer; and (f) a second gate electrode formed on said lightly doped region of said drain diffusion layer for controlling the number of carriers in said drain diffusion layer, said second gate electrode for receiving a voltage for varying carrier concentration in said lightly doped region.

13. An insulating gate type field effect transistor comprising:

(a) a substrate having a first conductivity;

(b) a drain diffusion layer formed at a surface of said substrate, said drain diffusion layer having a second conductivity and including two lightly doped regions and a heavily doped region sandwiched between said two lightly doped regions, said drain diffusion layer having a length on an order of one of microns and tens of microns;

(c) a source diffusion layer formed at a surface of said substrate and having a second conductivity;

(d) an insulating film covering said substrate;

(e) a first gate electrode formed on said insulating film between said source and drain diffusion layers; and (f) two second gate electrodes formed on said two lightly doped regions of said drain diffusion layer for controlling the number of carriers in said two lightly doped regions of said drain diffusion layer, said two second gate electrodes for receiving a voltage for varying carrier concentration in said two lightly doped regions.

14. The insulating gate type field effect transistor as set forth in claim 13, wherein said two second gate electrodes are disposed in symmetry with each other about said heavily doped region of said drain diffusion layer.

15. An insulating gate type field effect transistor comprising:

(a) a substrate having a first conductivity;

(b) a drain diffusion layer formed at a surface of said substrate and having a second conductivity, said drain diffusion layer including a lightly doped region and a heavily doped region, said drain diffusion layer having a length on an order of one of microns and tens of microns;

(c) a source diffusion layer formed at a surface of said substrate and having a second conductivity, said source diffusion layer including a lightly doped region and a heavily doped region;

(d) an insulating film covering said substrate;

(e) a first gate electrode formed on said insulating film between said lightly doped regions of said drain and source diffusion layer;

(f) a second gate electrode formed on said lightly doped region of said drain diffusion layer for controlling the number of carriers in said drain diffusion layer, said second gate electrode for receiving a voltage for varying carrier concentration in said lightly doped region of said drain diffusion layer; and (g) a third gate electrode formed on said lightly doped region of said source diffusion layer for controlling the number of carriers in said source diffusion layer, said third gate electrode for receiving a voltage for varying carrier concentration in said lightly doped region of said source diffusion layer.

16. The insulating gate type field effect transistor as set forth in claim 15, wherein said second and third gate electrodes are disposed in symmetry with each other about said first gate electrode.

17. A semiconductor device, comprising:

(a) a substrate having a first conductivity;

(b) a source region formed at a surface of said substrate, said source including a heavily doped region of said first conductivity and a heavily doped region of a second conductivity;

(c) a drain region formed at a surface of said substrate, said drain region having said second conductivity and including a lightly doped region and a heavily doped region;

(d) an insulating film covering said substrate;

(e) a first gate electrode formed on said insulating film between said source region and said drain region; and (f) a second gate electrode formed on said insulating film above said lightly doped region of said drain region for controlling the number of carriers in said lightly doped region of said drain region.

18. The semiconductor device as set forth in claim 17, wherein said device is free of a gate electrode over said source region.

19. A semiconductor device, comprising:

(a) a substrate having a first conductivity;

(b) a source region formed at a surface of said substrate;

(c) a drain region formed at a surface of said substrate, said drain region having said second conductivity and including a lightly doped region and a heavily doped region;

(d) an insulating film covering said substrate;

(e) a first gate electrode formed on said insulating film between said source region and said drain region; and (f) a second gate electrode formed on said insulating film above said lightly doped region of said drain region for controlling the number of carriers in said lightly doped region of said drain region;

wherein said device is free of a gate electrode over said source region.

* * * * *